(12) United States Patent
Hu

(10) Patent No.: US 7,187,047 B2
(45) Date of Patent: *Mar. 6, 2007

(54) METHOD AND STRUCTURE FOR REDUCING RESISTANCE OF A SEMICONDUCTOR DEVICE FEATURE

(75) Inventor: Yongjun J. Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/225,450

(22) Filed: Sep. 13, 2005

(65) Prior Publication Data

US 2006/0006481 A1    Jan. 12, 2006

Related U.S. Application Data

(63) Continuation of application No. 10/719,047, filed on Nov. 20, 2003, now Pat. No. 6,943,416.

(51) Int. Cl.
   *H01L 29/76* (2006.01)
(52) U.S. Cl. ..................... 257/412; 257/751
(58) Field of Classification Search ............... 257/412, 257/413, 751, 757, 763, 764, 915
   See application file for complete search history.

(56) References Cited

U.S. PATENT DOCUMENTS

| | | | |
|---|---|---|---|
| 6,075,274 A | 6/2000 | Wu et al. | 257/413 |
| 6,221,762 B1 | 4/2001 | Byun et al. | 438/643 |
| 6,297,152 B1 | 10/2001 | Itoh et al. | 438/649 |
| 6,365,507 B1 | 4/2002 | Hu | 438/627 |
| 6,451,644 B1 | 9/2002 | Yu | 438/230 |
| 6,486,060 B2 | 11/2002 | Hermes et al. | 438/649 |
| 6,589,884 B1 | 7/2003 | Torek | 438/755 |
| 6,943,416 B2 * | 9/2005 | Hu | 257/412 |
| 2004/0207030 A1 | 10/2004 | McTeer | 257/412 |
| 2005/0110058 A1 | 5/2005 | Hu | 257/288 |

* cited by examiner

*Primary Examiner*—Mark V. Prenty
(74) *Attorney, Agent, or Firm*—Kevin D. Martin

(57) ABSTRACT

A method used to form a semiconductor device comprises forming a polysilicon layer, forming a conductive barrier layer on the polysilicon layer, then forming a conductive nitride layer on the conductive barrier layer. Next, a conductive amorphous layer is formed on the conductive barrier layer, and an elemental metal layer is formed on the conductive amorphous layer. Without the conductive amorphous layer the elemental metal layer would form on the conductive nitride layer as a small grained, high resistance layer, while it forms on the conductive amorphous layer as a large grained, low resistance layer. A semiconductor device which may be formed using this method is also described.

17 Claims, 7 Drawing Sheets

200

METHOD AND STRUCTURE FOR REDUCING RESISTANCE OF A SEMICONDUCTOR DEVICE FEATURE

This is a continuation of U.S. application Ser. No. 10/719,047 filed Nov. 20, 2003 and issued Sep. 13, 2005 as U.S. Pat. No. 6,943,416.

FIELD OF THE INVENTION

This invention relates to the field of semiconductor manufacture and, more particularly, to a method for forming a conductive feature which has reduced resistance over previous structures.

BACKGROUND OF THE INVENTION

The formation of semiconductor devices such as dynamic random access memories (DRAMs), static random access memories (SRAMs), microprocessors, and logic devices requires the manufacture of a plurality of word lines and/or transistor gate stacks over the surface of a semiconductor wafer. In the recent past, the word line was formed using polysilicon as the sole conductor for the word line. As line widths continued to decrease, however, the conductivity of the polysilicon was not sufficient and the resistance of the word line became too great to produce a reliable device with desirable electrical properties. To overcome this problem with polysilicon, a tungsten silicide ($WSi_x$) layer was formed over the polysilicon to decrease the resistance of the word line and to increase conductivity. However, as line widths have continued to decrease, the conductivity of the polysilicon and tungsten silicide layers became insufficient for the word line.

A current design of a transistor gate stack is illustrated in FIG. 1, which depicts the following structures: a semiconductor wafer 10 having doped regions 12 therein; shallow trench isolation (STI) 14; gate oxide 15; a control gate comprising conductively-doped polysilicon 16, tungsten nitride ($WN_x$) 18, and tungsten (W) 20; silicon nitride ($Si_3N_4$) capping layer 22; first silicon nitride spacers 24; and second silicon nitride spacers 26. Various other structures may also be present in the device represented by FIG. 1 which are not immediately germane to the present invention and, for simplicity of explanation, are not depicted.

During functioning of the transistor stack depicted in FIG. 1, the polysilicon 16, tungsten nitride 18, and tungsten 20 layers together function as the transistor control gate and word line for the semiconductor device. The tungsten metal layer provides greatly improved conductivity over previous devices which used polysilicon alone or polysilicon and tungsten silicide to provide improved conductivity of the word line. The conductive tungsten nitride layer, while less conductive than the tungsten, prevents the polysilicon from reacting with the tungsten layer which would form tungsten silicide $WSi_x$. This $WSi_x$ layer is avoided because it forms with an irregular thickness, is difficult to remove during formation of the transistor gate stack, and has a higher resistance than the tungsten nitride. If the tungsten nitride layer is not provided and the $WSi_x$ layer forms between the polysilicon and tungsten, it requires an over etch to ensure that the thicker portions of the $WSi_x$ are removed. This may require etching into the polysilicon underlying the thinner portions of the $WSi_x$ layer before the thicker $WSi_x$ portions are completely removed and results in an over etched polysilicon layer. Over etching the polysilicon at this step forms pits in the polysilicon. Then, when the polysilicon is etched after forming first nitride spacers 24, these pits are carried through the polysilicon into the gate oxide then into the substrate 10. It is well known that pitting the substrate is to be avoided as it negatively affects the electrical characteristics of the substrate and devices formed thereon.

A problem which may occur with the FIG. 1 structure is that the tungsten nitride 18 can decompose, and free nitrogen may react with the polysilicon 16 to form a thin insulative silicon nitride dielectric layer. This dielectric layer reduces the conductivity between the polysilicon 16 and the tungsten nitride 18, and thus reduces the conductivity between the polysilicon 16 and the tungsten 20. Such an effect will increase the vertical contact resistance of the via, and may degrade the high frequency response of the device. This may result in a device which uses excessive power, has a reduced speed, and possibly a partially functional and unreliable device or a completely nonfunctional device.

A method for forming a semiconductor device, and a semiconductor device having a particular structure, which reduces or eliminates the problems described above would be desirable.

SUMMARY OF THE INVENTION

The present invention provides a new method and structure which, among other advantages, reduces problems associated with the manufacture of semiconductor devices. Embodiments of the invention reduce or eliminate the spontaneous and undesirable formation of an insulative layer between two conductive layers as described with reference to FIG. 1.

An embodiment of the invention includes a transistor gate stack, and a method for forming the stack, which comprises a polysilicon layer, a titanium nitride layer over the polysilicon layer, a tungsten nitride layer over the titanium nitride layer, a tantalum silicide layer ($TaSi_2$) over the tungsten nitride layer, and a tungsten layer on the $TaSi_2$ layer. This stack eliminates the formation of a silicon nitride dielectric layer between a polysilicon layer and a tungsten nitride layer, and prevents the formation of a crystalline $W_2N$ layer such that a tungsten metal layer formed thereover forms as a large grain, low resistance structure.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
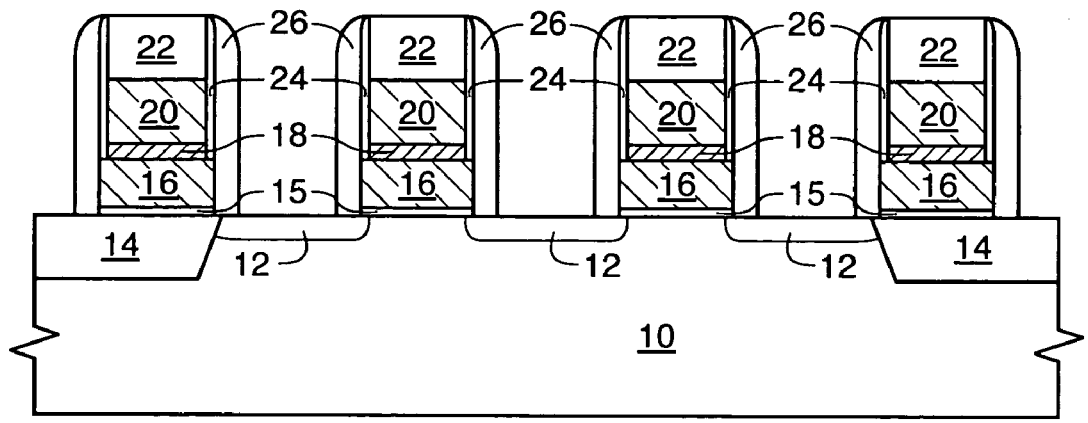
FIG. 1 is a cross section depicting a conventional transistor arrangement.
Figure 2:
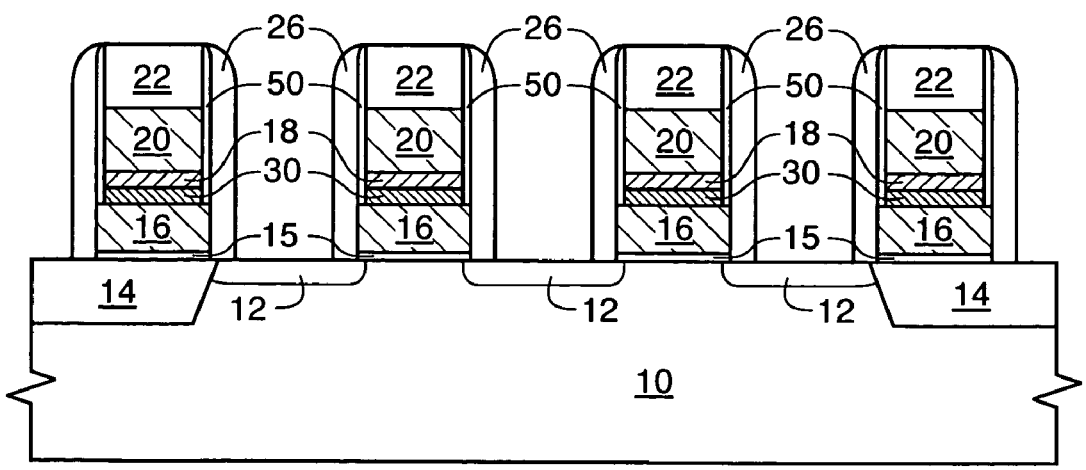
FIG. 2 is a cross section depicting a first transistor arrangement which overcomes problems associated with conventional transistors.

A structure which overcomes the problems discussed relative to FIG. 1 above is described in U.S. patent application Ser. No. 10/418,412 filed Apr. 16, 2003 by Everett A. McTeer, assigned to Micron Technology, Inc., and incorporated herein by reference as if set forth in its entirety. A structure described in this copending application is illustrated in FIG. 2 which depicts a transistor gate stack which does not result in the thin insulative silicon nitride dielectric layer of the FIG. 1 structure. FIG. 2 depicts transistor gate stacks each comprising gate oxide 15, polysilicon 16, titanium nitride ($TiN_x$) 30, tungsten nitride 18, tungsten 20 and dielectric capping layer 22. Due to titanium nitride 30, the interface between polysilicon 16 and tungsten nitride 18 is removed, and thus no silicon nitride layer can form from interaction between polysilicon 16 and $WN_x$ 18.

With the FIG. 1 embodiment, tungsten nitride layer 18 forms on polysilicon layer 16 as an amorphous layer, and tungsten layer 20 forms on amorphous tungsten nitride layer 18 as an amorphous layer. Amorphous tungsten is a large grain layer having a low resistance, which is desirable with devices having small cross sections. In some instances, tungsten nitride layer 18 of FIG. 2 may form on crystalline titanium nitride layer 30 as a crystalline $W_2N$ layer rather than as an amorphous layer. Tungsten layer 20 may then form on this crystalline $W_2N$ layer 18 as a fine grain layer having a comparatively high resistance. The bulk resistance of tungsten layer 20 may, in some instances, increase from about 15 microohm-cm ($\mu\Omega$-cm) for the FIG. 1 structure to about 30 $\mu\Omega$-cm for the FIG. 2 structure. It is often desirable to find ways to decrease the resistance of a feature.

Figure 3:
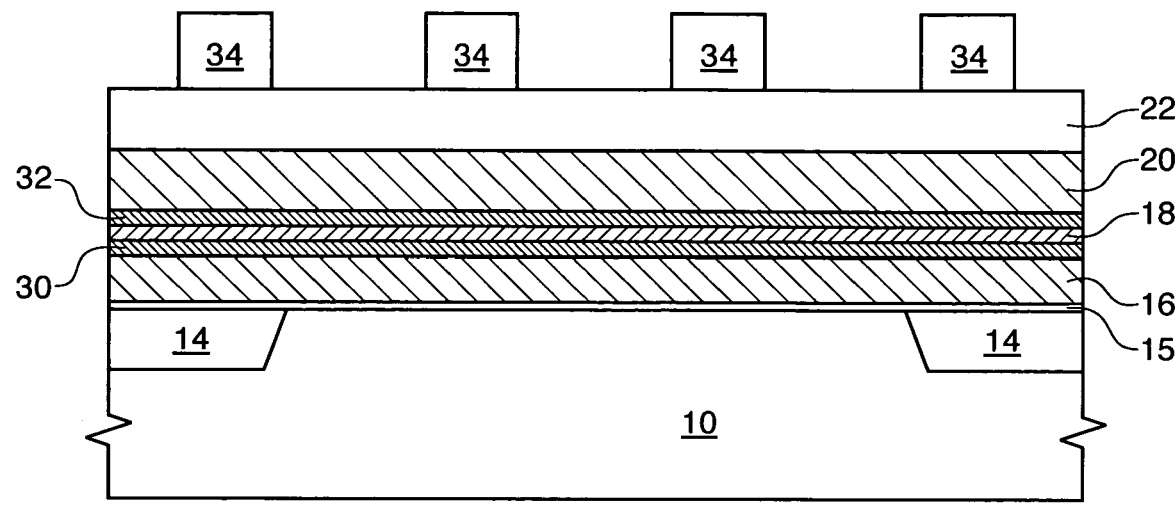
FIGS. 3–9 are cross sections of various intermediate structures found during the formation of a second transistor arrangement using a first illustrative embodiment of the invention.

FIG. 3 depicts an in-process semiconductor device structure comprising a semiconductor wafer 10, shallow trench isolation (STI) 14, blanket layers of gate oxide 15, polysilicon 16, titanium nitride 30, tungsten nitride ($WN_x$) 18, tantalum silicide ($TaSi_x$) 32, tungsten 20, and silicon nitride ($Si_3N_4$) 22. A patterned photoresist (resist) layer 34 is formed over regions to define transistor gate stacks. Layer 32 may also be an amorphous tungsten silicide ($WSi_x$) formed using physical vapor deposition (PVD), but its adhesion to polysilicon 16 may not be as desirable as that of tantalum silicide.

In this exemplary embodiment of the invention, polysilicon layer 16 is between about 200 angstroms (Å) and about 1,000 Å thick, titanium nitride 30 is between about 70 Å and about 200 Å thick, tungsten nitride layer 18 is between about 50 Å and about 200 Å thick, tantalum silicide layer 32 is between about 25 Å and about 50 Å thick, tungsten layer 20 is between about 100 Å and about 500 Å thick, and $Si_3N_4$ layer 22 is between about 1,000 Å and about 2,000 Å thick. Layers 10–30 and 34 can be manufactured by one of ordinary skill in the art.

Titanium nitride layer 30 inhibits or prevents spontaneous and undesirable chemical or physical interaction between conductive polysilicon layer 16 and the tungsten nitride layer 18. As discussed above, interaction between these two layers may result in the formation of a silicon nitride dielectric layer which increases the resistance between the polysilicon layer and the conductive tungsten nitride layer.

Tungsten nitride layer 18 forms on titanium nitride layer 30 as a crystalline $W_2N$ layer. If formed directly on crystalline tungsten nitride, tungsten layer 20 will form as a crystalline fine grained, high resistance layer. To prevent tungsten layer 20 from forming as a fine grained structure, an intermediate amorphous layer 32 is formed on crystalline tungsten nitride layer 18 before forming tungsten layer 20. This intermediate layer 32 may be an as-deposited (i.e. deposited at room temperature) amorphous tantalum silicide (a-$TaSi_2$) layer, although other amorphous materials such as amorphous $WSi_x$ or other as-deposited amorphous refractory metal silicides such as hafnium silicide (HfSi) and molybdenum silicide ($MoSi_2$) may also be sufficient. An a-$TaSi_2$ between about 25 Å and about 50 Å thick can be formed using a PVD sputter process, for example using argon gas at a flow rate of between about 30 standard cubic centimeters per minute (sccm) and about 90 sccm at a temperature of between about 0° C. and about 100° C. This layer forms at a rate of between about 240 Å/min and about 360 Å/min, so for the layer between about 25 Å and about 50 Å thick, the process is performed for between about 4 seconds and about 13 seconds.

After forming each of layers 15–32, a patterned photoresist layer 34 is formed which will define transistor gate stacks. Subsequent to forming resist 34, silicon nitride layer 22, tungsten layer 20, tantalum silicide 32, tungsten nitride layer 18, and titanium nitride 30 are etched to expose layer 16 to result in the structure of FIG. 4. The silicon nitride 22 and tungsten 20 can be etched according to means known in the art. The tantalum silicide 32, tungsten nitride 18, and titanium nitride 30 may be etched by flowing $Cl_2$ at a flow rate of between about 5 standard cubic centimeters per minute (sccm) and about 75 sccm, $NF_3$ at a flow rate of between about 20 sccm and about 60 sccm, and/or $CF_4$ at a flow rate of about 25 sccm while subjecting the wafer to an atmospheric pressure of between about 5 millitorr (mT) and about 10 mT, a top power of between about 150 watts to about 350 watts and a bottom power of between about 25 watts and about 100 watts. Such an etch removes the $TaSi_2$ 32, $WN_x$ 18, and $TiN_x$ 30 and the etch is timed to stop at (i.e. on or within) the polysilicon layer 16 with as minimal etching of the polysilicon 16 as possible.

Figure 4:
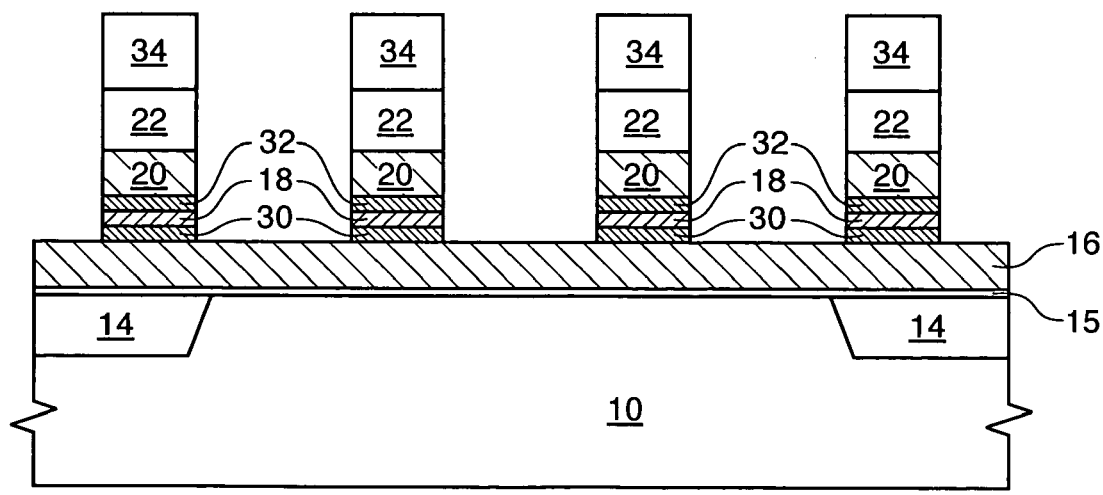
Figure 5:
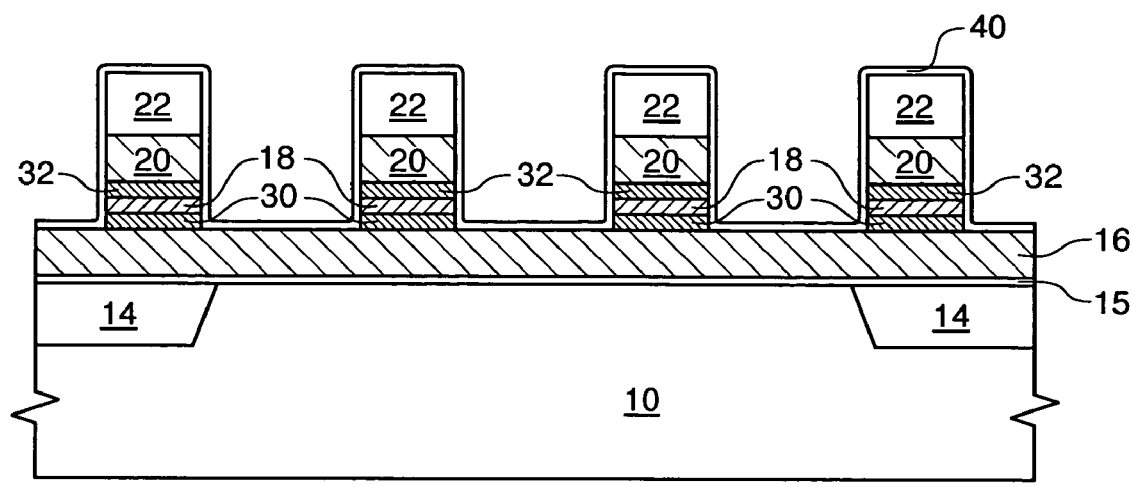
Figure 6:
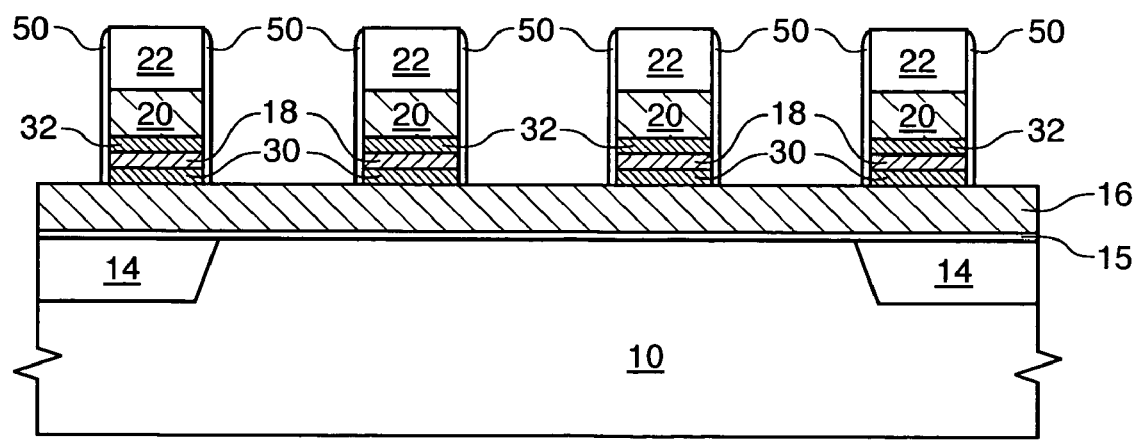

After forming the FIG. 4 structure the resist 34 is removed and a conformal silicon nitride ($Si_3N_4$) layer 40 is formed as depicted in FIG. 5 to a thickness of between about 60 Å and about 100 Å. A spacer etch of layer 40 is performed to form protective nitride spacers 50 as depicted in FIG. 6 over sidewalls formed in layers 30, 18, 20, and 22. Silicon nitride spacers 50 protect the tungsten structures from oxygen diffusion during selective oxidation.

Figure 7:
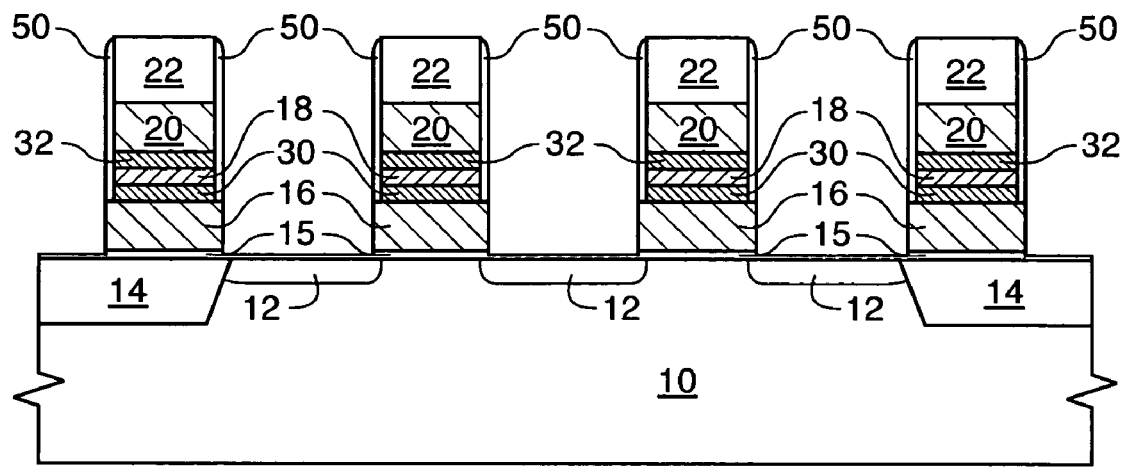

After forming spacers 50, a vertical anisotropic etch is performed using the upper part of the transistor gate stack as a pattern to result in the transistor gate as depicted in FIG. 7. The etch is performed using an etchant which removes polysilicon 16 selective to silicon nitride 22, 50 and gate oxide 15. After etching polysilicon 16 and stopping on gate oxide 15, a source/drain implant is performed to form transistor source/drain (active area) regions 12.

Figure 8:
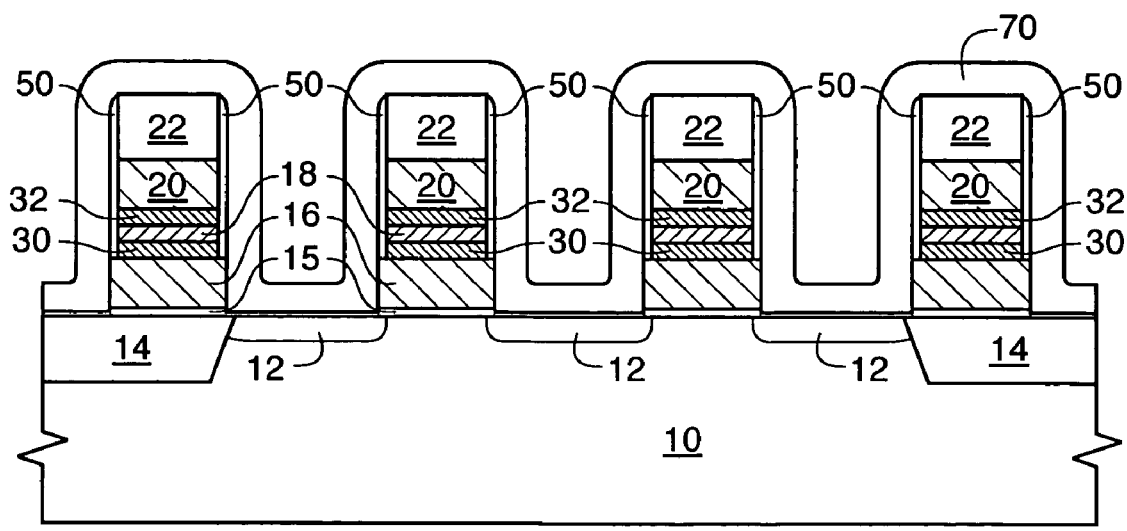
Figure 9:
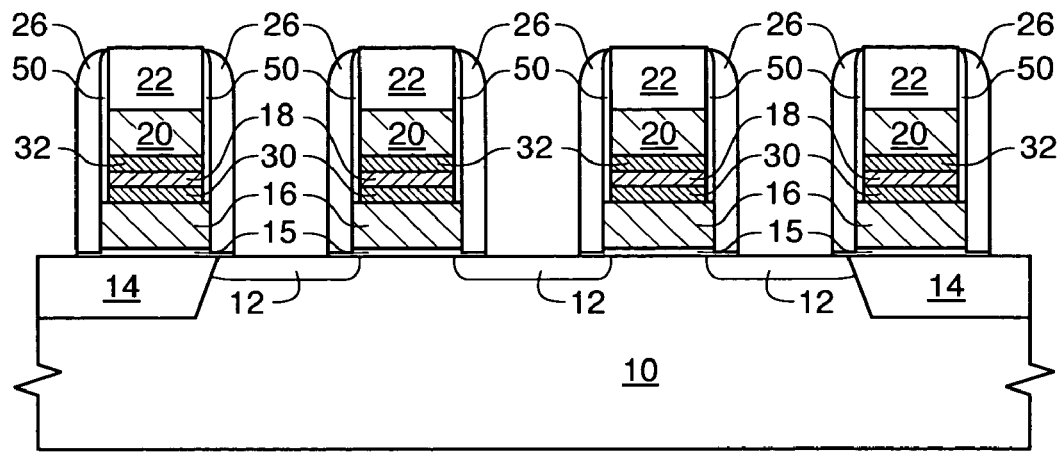

Subsequent to the implant of regions 12, another conformal silicon nitride layer 70 is formed to result in the structure of FIG. 8. A vertical anisotropic etch is performed using an etchant which removes silicon nitride selective to oxide, such that the etch stops on the gate oxide 15. After this first etch is completed, the exposed gate oxide is etched to result in the structure of FIG. 9 comprising nitride spacers 26 on nitride spacers 50 and on sidewalls formed in polysilicon 16. This silicon nitride 26 electrically isolates polysilicon control gate layer 16 from conductive structures subsequently formed which contact diffusion regions 12. Wafer processing continues according to means known in the art.

As stated above, the transistor structure of FIG. 2 may have a bulk resistance of about 30 microohm-cm ($\mu\Omega$-cm). Using the amorphous tantalum silicide layer of the present embodiment of the invention, the bulk resistance is decreased to between about 15 to about 16 $\mu\Omega$-cm.

Figure 10:
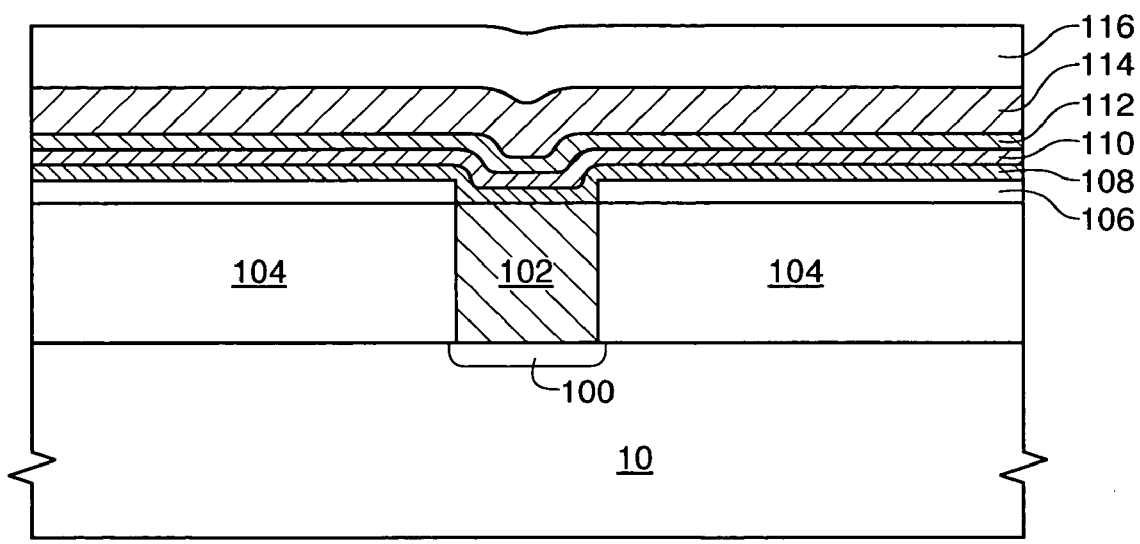
FIG. 10 is a cross section of an intermediate structure found during the formation of a digit line using a second illustrative embodiment of the invention.

A layer similar to layer 32 may also be used during the formation of other structures, for example a buried digit line. As with conventional transistor gate stacks discussed above, conventional buried digit line contacts require additional layers to enhance conductivity because as feature sizes decrease the polysilicon material used for a contact plug is not sufficiently conductive to insure functionality of the device. If tungsten nitride is formed directly on the polysilicon plug to enhance conductivity, the polysilicon can react with the tungsten nitride to form a thin silicon nitride layer between the tungsten nitride and the polysilicon. Thus a layer of titanium nitride can be formed between the polysilicon and the tungsten nitride to prevent this reaction. While the tungsten nitride forms on polysilicon as an amorphous layer, it forms on titanium nitride as a crystalline $W_2N$ layer. When tungsten metal forms on an amorphous $TaSi_x$ layer, it forms as a large grain, low resistance layer. However, when it forms on a crystalline $W_2N$ layer, it forms as a small grain layer with high resistance, which is to be avoided This second embodiment of the present invention is depicted in FIG. 10. FIG. 10 depicts a semiconductor wafer 10 having a conductively-doped region 100 therein, and a conductive polysilicon plug 102 formed in a first dielectric layer 104, for example borophosphosilicate glass (BPSG). FIG. 10 further comprises a second dielectric layer 106, for example tetraethyl orthosilicate (TEOS), a titanium nitride ($TiN_x$) layer 108, a tungsten nitride layer 110, a tantalum silicide layer 112, a tungsten metal layer 114, and a silicon nitride layer 116.

The tungsten nitride layer 110 forms on the titanium nitride layer 108 as a crystalline $W_2N$ layer. To prevent tungsten metal layer 114 from forming as a small grain layer with high resistance, the amorphous tantalum silicide layer 112 is first formed on tungsten nitride layer, then the tungsten metal layer is formed on the amorphous $TaSi_2$ layer. An amorphous $TaSi_2$ layer between about 25 Å and about 50 Å can be formed according to the process described for the previous embodiment of the invention described above.

Figure 11:
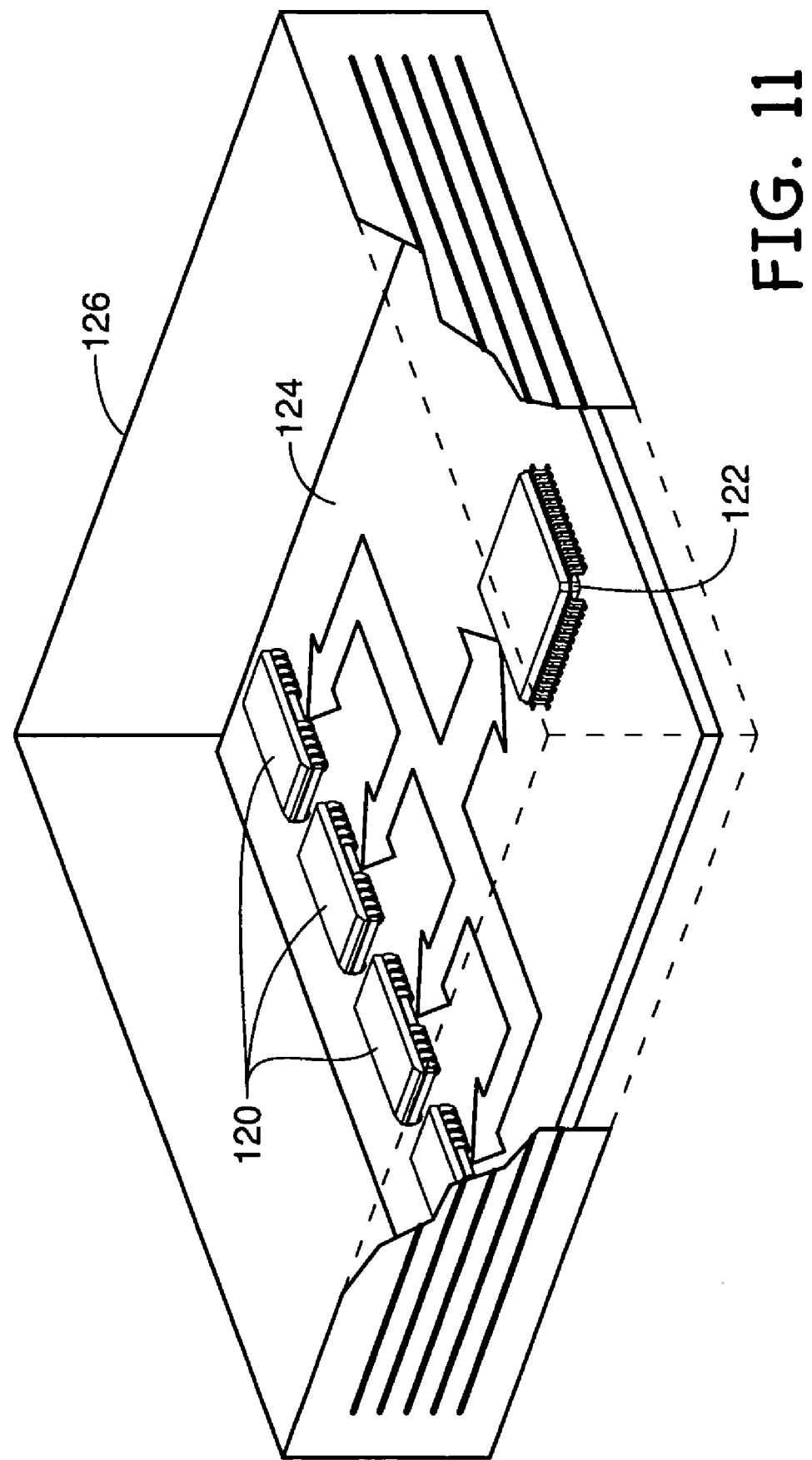
FIG. 11 is an isometric depiction of a use of the invention in an electronic device.

As depicted in FIG. 11, a semiconductor device 120 formed in accordance with the invention may be attached along with other devices such as a microprocessor 122 to a printed circuit board 124, for example to a computer motherboard or as a part of a memory module used in a personal computer, a minicomputer, or a mainframe 126. FIG. 11 may also represent use of device 120 in other electronic devices comprising a housing 126, for example devices comprising a microprocessor 122, related to telecommunications, the automobile industry, semiconductor test and manufacturing equipment, consumer electronics, or virtually any piece of consumer or industrial electronic equipment.

Figure 12:
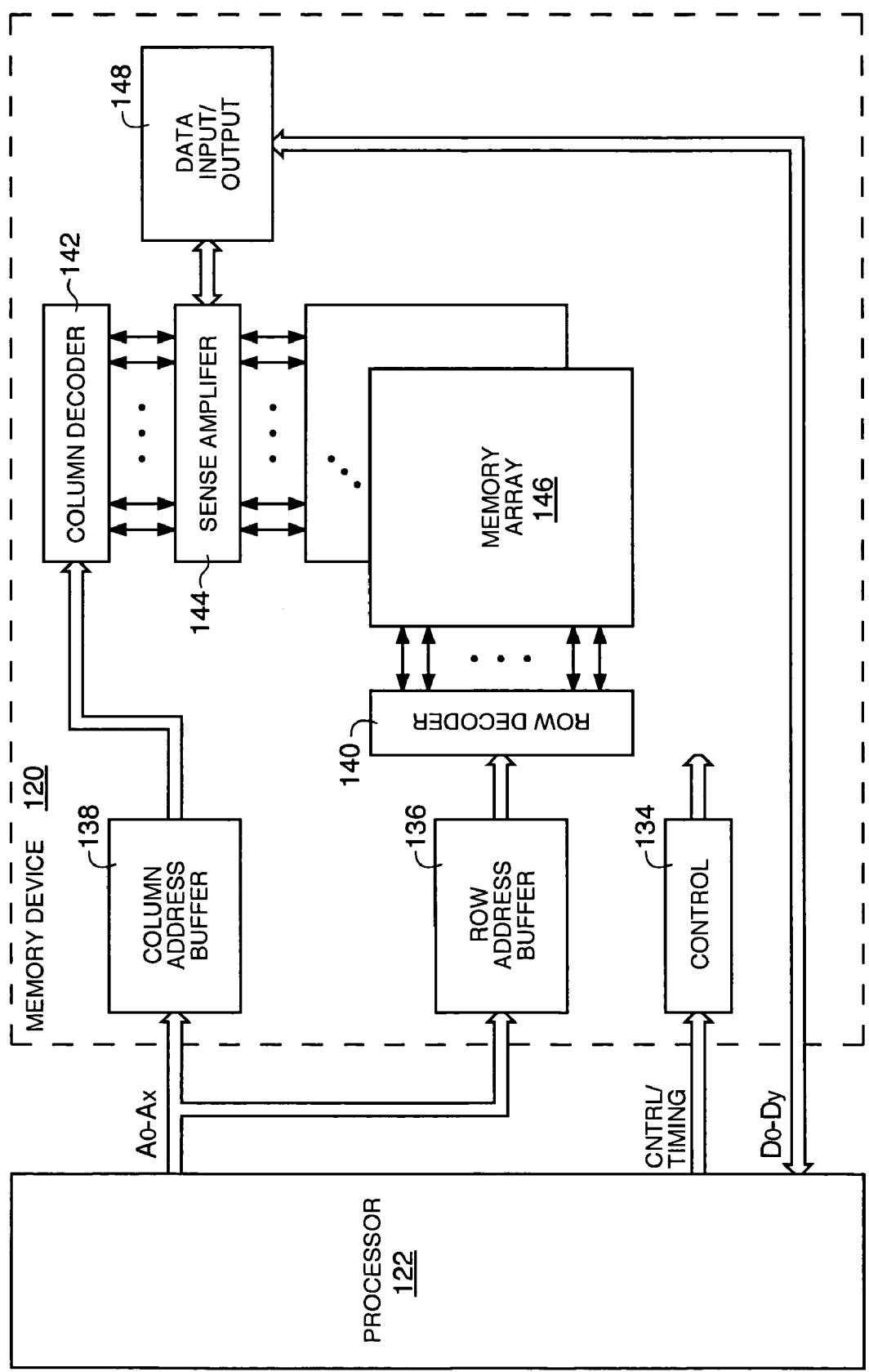
FIG. 12 is a block diagram of an exemplary use of the invention to form part of a transistor array in a memory device.

The process and structure described herein can be used to manufacture a number of different structures. FIG. 12, for example, is a simplified block diagram of a memory device such as a dynamic random access memory having transistors, digit lines, and possibly other features which may be formed using an embodiment of the present invention. The general operation of such a device is known to one skilled in the art. FIG. 12 depicts a processor 122 coupled to a memory device 120, and further depicts the following basic sections of a memory integrated circuit: control circuitry 134; row 136 and column 138 address buffers; row 140 and column 142 decoders; sense amplifiers 144; memory array 146; and data input/output 148.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An electronic device, comprising:
   a semiconductor device comprising a transistor gate, wherein the transistor gate comprises:
   a polysilicon layer;
   a titanium nitride layer contacting the polysilicon layer;
   a tungsten nitride layer contacting the titanium nitride layer;
   an amorphous conductive layer contacting the titanium nitride layer; and
   tungsten metal layer contacting the amorphous conductive layer.

2. The electronic device of claim 1, wherein the amorphous conductive layer of the transistor gate is an amorphous refractory metal silicide layer.

3. The electronic device of claim 1, wherein the amorphous conductive layer of the transistor gate is an amorphous tantalum silicide layer.

4. The electronic device of claim 1, wherein the amorphous conductive layer of the transistor gate is an amorphous tungsten silicide layer.

5. The electronic device of claim 1, wherein the amorphous conductive layer of the transistor gate comprises a material selected from the group consisting of amorphous hafnium silicide and amorphous molybdenum silicide.

6. The electronic device of claim 1, wherein the transistor gate is part of a word line for a semiconductor memory device.

7. An electronic device comprising:
a semiconductor device comprising a digit line and digit line plug, wherein at least one of the digit line and digit line plug comprises:
a polysilicon layer;
a titanium nitride layer contacting the polysilicon layer;
a tungsten nitride layer contacting the titanium nitride layer;
an amorphous conductive layer contacting the titanium nitride layer; and
tungsten metal layer contacting the amorphous conductive layer.

8. The electronic device of claim 7, wherein the amorphous conductive layer is an amorphous refractory metal silicide layer.

9. The electronic device of claim 7, wherein the amorphous conductive layer is an amorphous tantalum silicide layer.

10. The electronic device of claim 7, wherein the amorphous conductive layer is an amorphous tungsten silicide layer.

11. The electronic device of claim 7, wherein the amorphous conductive layer comprises a material selected from the group consisting of amorphous hafnium silicide and amorphous molybdenum silicide.

12. An electronic system comprising a microprocessor and a memory device, wherein at least one of the microprocessor and the memory device comprises:
a transistor gate, wherein the transistor gate comprises:
a polysilicon layer;
a titanium nitride layer contacting the polysilicon layer;
a tungsten nitride layer contacting the titanium nitride layer;
an amorphous conductive layer contacting the titanium nitride layer; and
tungsten metal layer contacting the amorphous conductive layer.

13. The electronic system of claim 12, wherein the amorphous conductive layer of the transistor gate is an amorphous refractory metal silicide layer.

14. The electronic system of claim 12, wherein the amorphous conductive layer of the transistor gate is an amorphous tantalum silicide layer.

15. The electronic system of claim 12, wherein the amorphous conductive layer of the transistor gate is an amorphous tungsten silicide layer.

16. The electronic system of claim 12, wherein the amorphous conductive layer of the transistor gate comprises a material selected from the group consisting of amorphous hafnium silicide and amorphous molybdenum silicide.

17. The electronic system of claim 12, wherein the transistor gate is part of a word line for a semiconductor memory device.

* * * * *